(12) United States Patent
Tomar

(10) Patent No.: US 11,071,205 B2
(45) Date of Patent: *Jul. 20, 2021

(54) CONTROL UNIT

(71) Applicant: JAGUAR LAND ROVER LIMITED, Warwickshire (GB)

(72) Inventor: Ashutosh Tomar, Coventry (GB)

(73) Assignee: JAGUAR LAND ROVER LIMITED, Coventry (GB)

( * ) Notice: Subject to any disclaimer, the term of this patent is extended or adjusted under 35 U.S.C. 154(b) by 0 days.

This patent is subject to a terminal disclaimer.

(21) Appl. No.: 16/338,508

(22) PCT Filed: Oct. 6, 2017

(86) PCT No.: PCT/EP2017/075500
§ 371 (c)(1),
(2) Date: Apr. 1, 2019

(87) PCT Pub. No.: WO2018/165585
PCT Pub. Date: Apr. 12, 2018

(65) Prior Publication Data
US 2020/0045823 A1 Feb. 6, 2020

(30) Foreign Application Priority Data

Oct. 7, 2016 (GB) .................. 1617055
Oct. 7, 2016 (GB) .................. 1617056
(Continued)

(51) Int. Cl.
*H05K 1/18* (2006.01)
*B60R 16/02* (2006.01)
(Continued)

(52) U.S. Cl.
CPC ............ *H05K 1/185* (2013.01); *B60R 16/02* (2013.01); *H05K 1/162* (2013.01); *H05K 3/284* (2013.01);
(Continued)

(58) Field of Classification Search
USPC .............................................. 361/761
See application file for complete search history.

(56) References Cited

U.S. PATENT DOCUMENTS 4,843,520 A  6/1989 Nakatani et al.
5,584,704 A  12/1996 Romann et al.
(Continued)

FOREIGN PATENT DOCUMENTS

CN   104601762 A   5/2015
GB      2451676 A   2/2009
JP   H01241411 A   9/1989

OTHER PUBLICATIONS

Combined Search and Examination Report under Sections 17 and 18(3) for Application No. GB1617056.5 dated Mar. 20, 2017.
(Continued)

*Primary Examiner* — Andargie M Aychillhum
(74) *Attorney, Agent, or Firm* — Carlson, Gaskey & Olds

(57) ABSTRACT

A control unit (10) for an apparatus (12), the control unit (10) comprising a component-carrying member (14; 114; 18; 118) provided with at least one electronic component (30, 32, 34, 36, 38; 60, 62; 74, 78) configured to provide a function of the apparatus (12); wherein the component-carrying member is formed of a material that is pliable at least during assembly of the control unit (10). The control unit is provided with an injection moulded layer (22; 22') encapsulating at least a part of the or each electronic component (30, 32, 34, 36, 38; 60, 62; 74, 78).

18 Claims, 14 Drawing Sheets

(30) Foreign Application Priority Data

Oct. 7, 2016 (GB) ...................................... 1617058
Oct. 7, 2016 (GB) ...................................... 1617061

(51) Int. Cl.
*H05K 1/16* (2006.01)
*H05K 3/28* (2006.01)

(52) U.S. Cl.
CPC .............. *H05K 2201/09118* (2013.01); *H05K 2203/1316* (2013.01)

(56) References Cited

U.S. PATENT DOCUMENTS

| | | |
|---|---|---|
| 6,158,867 A | 12/2000 | Parker et al. |
| 2007/0235548 A1 | 10/2007 | Singleton |
| 2009/0059498 A1 | 3/2009 | Jeong et al. |
| 2014/0307404 A1 | 10/2014 | Singleton |
| 2015/0062825 A1 | 3/2015 | Ossimitz et al. |
| 2015/0313003 A1 | 10/2015 | Kasar |
| 2016/0192474 A1* | 6/2016 | Niskala ................ G06F 1/1658 361/679.55 |
| 2016/0192499 A1 | 6/2016 | Chen et al. |

OTHER PUBLICATIONS

International Search Report and Written Opinion of the International Searching Authority for International application No. PCT/EP2017/075500 dated Jan. 30, 2018.

Combined Search and Examination Report under Sections 17 and 18(3) for Application No. GB1716356.9 dated Apr. 6, 2018.

* cited by examiner

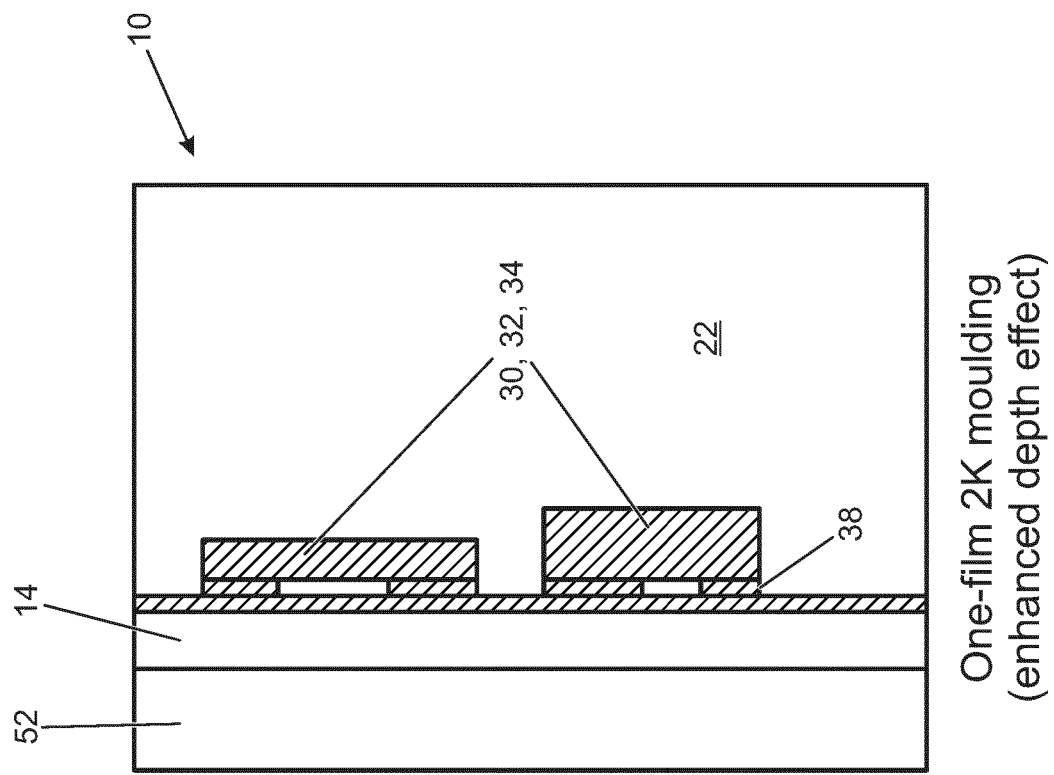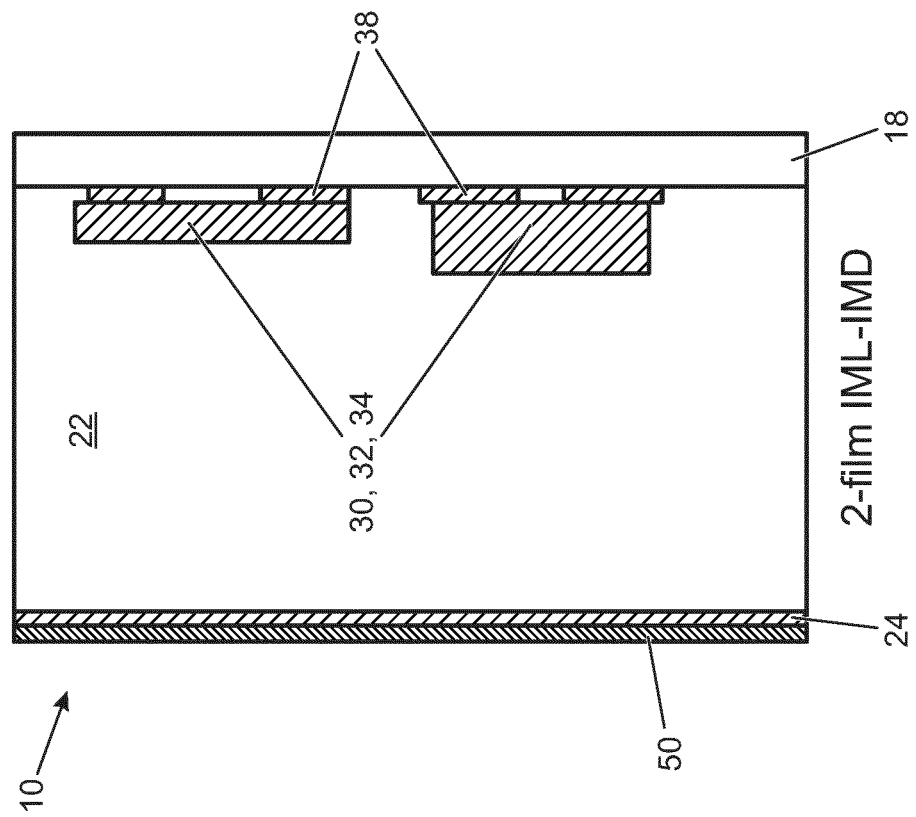

CONTROL UNIT

TECHNICAL FIELD

The present disclosure relates to a control unit for an apparatus. In particular, but not exclusively, the invention relates to a control unit including electronic components and/or microprocessors relating to operation of the apparatus. The control unit has particular but not exclusive application in a vehicle. Aspects of the invention relate to a control unit, an apparatus and a method of manufacture.

BACKGROUND

Modern day motor vehicles have numerous different systems and subsystems which require electronic control units (ECUs), or controllers, to power and control their functionality. Examples of the control units required include those for the various air bags distributed around the vehicle cabin, interior lights, front and rear seats, the entertainment module and/or DVD players, parking aids, various motion and other sensors, the power steering unit, and the terrain and navigation systems, to name but a few. Further electronic control units are also required to control the powertrain and the vehicle engine.

As the sophistication of vehicles increases, the need for so many control units poses a challenge for vehicle manufacturers because of the need to find accommodation space within the vehicle to house the units. In some current vehicles there can be as many as 80 different control units distributed throughout the vehicle. In addition to the problem of space for housing the control units, the wiring for the units and the weight that the units contribute to the vehicle is also a disadvantage.

A particular challenge with known control units is the limitation of their shape and size which restricts where the units can be housed. Traditionally control units are formed of a printed circuit board containing various electronic components and wiring which are housed within a rigid casing. The units need to be hidden within the vehicle, for aesthetic and safety reasons, and are often located behind the trim panels in the cabin. However space is limited in these regions and the inflexible design of the packaging for the control units means they cannot readily be accommodated in restricted spaces.

The present invention has been devised to mitigate or overcome at least some of the above-mentioned problems.

SUMMARY OF THE INVENTION

Aspects and embodiments of the invention provide a control unit for an apparatus, an apparatus, a method of manufacture and a vehicle as claimed in the appended claims.

According to one aspect of the present invention there is provided a control unit for an apparatus, the control unit comprising a component-carrying member provided with at least one electronic component configured to provide a function of the apparatus; wherein the component-carrying member is formed of a material that is pliable or flexible at least during assembly of the control unit; and an injection moulded layer encapsulating at least a part of the or each electronic component.

The control unit provides the advantage that it is convenient to manufacture and in the final version provides a lightweight yet robust control unit that occupies little accommodation space in the apparatus in which it is used.

A further benefit of the invention is that, because the component-carrying member is formed from a material that is pliable, or flexible, at least during the assembly stage of the control unit, the component-carrying member can be manipulated to adopt a variety of different shapes, depending on the requirements for the final product. For example, the control unit need not be flat and may be shaped to have a curved, undulating or non-planar profile.

Moreover, as part of the manufacturing process, as the injection moulded layer is formed over the component-carrying member, the layer and the member can be shaped together to define the required shape for the end-product.

Depending on the material that is chosen for the component-carrying member, the effect of providing the injection moulded layer on top is that the two materials tend to 'fuse' together so that in the final product the electronics are effectively embedded within, fused or integrated with the materials of the structure. In other words, it appears in the final product that the components are 'suspended' within the structure, moulded between the materials of the injection moulded layer and the component-carrying member. In some embodiments it may be that the 'layer' structure of the final assembled control unit no longer consists of distinct 'layers' at all. The structural electronics, being moulded in this way, become a part of the load-bearing features for the control unit.

In one embodiment, the component-carrying member may be formed from a material that is pliable during the assembly stages, but which then 'sets' or becomes more rigid once the control unit has been assembled so as to define a rigid end product. Alternatively, the material from which the electronic-carrying component may be formed may retain a degree of pliability in its final form, once the control unit is fully assembled, so that the final product is, for example, flexible or bendable.

The invention therefore provides a highly versatile control unit structure which can be adapted for use in a wide range of different applications. For example, due to the pliable nature of the control unit, at least during the manufacturing stages, it can be adapted to a shape suitable for use as a lid of a glove compartment or an overhead control panel, which generally may have a curved surface area.

The control unit has particular application in a vehicle, wherein the at least one electronic component is configured to provide a function of the vehicle, for example a function in the form of control of the lighting system, the heating system, the entertainment system, the seating system, the airbag system, the sun roof, or the window.

Other embodiments envisage that the control unit forms a panel of a household appliance, such as electrical items in the form of washing machines, cookers or dishwashers and the like.

When used in a vehicle, the control unit provides the advantage that it is convenient to manufacture and in the final version provides a lightweight yet robust control unit that occupies little accommodation space within the vehicle. This is a particularly useful feature in modern day vehicles where vehicle functionality is high, and there is an ever increasing need for additional control functions. Furthermore, the or each electronic component is protected, at least in part, by the injection moulded layer which encapsulates the fragile and sensitive electronic components and circuitry. The user command may be the pressing of a button, a capacitive touch command such as a touch or swipe with a finger, a gesture or a voice activation command received by a microphone. The vehicle function may be a control signal to a component of the printed electronic circuit, such as the switching on of a light.

In one embodiment, the control unit comprises a presentation surface visible to a user of the apparatus, in use.

In one embodiment the component-carrying member defines the presentation surface.

In another embodiment the presentation surface defines a user-interaction surface for receiving a user command, and wherein the component-carrying member is operable in response to the user command.

It may be advantageous to include a piezoelectric layer adjacent to the user-interaction surface to enable control of the at least one electronic component when the user applies a user command in the form of pressure to the user-interaction surface, thereby to control the or each of the electronic components.

The control unit may comprise a component-carrying surface which carries the or each electronic component, which may form a part of a printed electronic circuit.

For example, in one embodiment, the component-carrying surface may be on the reverse side of the component-carrying member to the presentation surface. This embodiment provides the advantage that only a single member is required to define both the presentation surface on one side and the components on the other side (i.e. the component-carrying surface). The control unit of this embodiment is particularly thin and lightweight, and can be formed using a single-stage injection moulded process to form the injection moulded layer.

The control unit may comprise a second member spaced from the component-carrying member by the injection moulded layer to define a three-part structure for the control unit.

The second member may define the presentation surface.

The component-carrying member and/or the second member may take the form of a pre-formed member i.e. a member that is formed prior to a step taken to form the injection moulded layer.

The three part structure of the component-carrying member, the second member, and the injection moulded layer between, is particularly suitable where there is a need for an A-surface with which the user interacts at the front of the control unit, and a B-surface at the rear of the control unit which carries the or each electronic component.

In another example, the second member may be provided with at least one further electronic component, so that the or each of the electronic components on the component-carrying member and the at least one further electronic component on the second member are sandwiched between the component-carrying member and the second member within the injection moulded layer.

This arrangement provides the advantage that the electronic components are distributed between different surfaces, which may have benefits for space and/or heat generation. The arrangement provides a particular advantage where the control unit is operated by means of gesture control, so that the components operated by gesture control are on the reverse of the A-surface but other components may be displaced from them and carried on the other member.

In one embodiment, the electronic component may form a part of a printed electronic circuit which may comprise a plurality of conductive tracks for carrying current to at least one electronic component of the printed electronic circuit.

The conductive tracks may act, together with the user-interaction surface, as electrodes of a capacitor to provide a capacitive touch control functionality in response to the user command.

Capacitive touch control provides a quick, effective and sophisticated feel of control for the user of the control unit.

In one embodiment, a greater number of conductive tracks may be provided on the printed electronic circuit than is required to provide adequate current to electronic components of the printed electronic circuit, thereby to provide track redundancy in the event of breakage and/or failure of one or more of the conductive tracks.

The benefit of providing track redundancy in this way is that any track breakage or malfunction due to damage caused during the step of forming the injection moulded layer, for example, is compensated for by the provision of additional tracks which still provide enable the necessary current to be applied to the electronic components of the circuit, in use. This is particularly beneficial as injection moulding techniques have to be performed at high temperatures.

In particular, but not exclusively, a greater number of conductive tracks may be provided on the printed electronic circuit in regions in the vicinity of a gate for injecting a material of the injection moulded layer during assembly of the control unit.

The control unit may comprise an additional layer provided on the user-interaction surface to provide an aesthetic finish to the control unit.

The additional layer may be a veneer which complements a surface of the apparatus in which the control unit is used, for example an interior trim of a vehicle. By complements it is intended to mean that the veneer may match or otherwise correspond in a complementary manner to the rest of the interior of the vehicle in which the control unit is installed. The veneer may be a wood finish, a plastic finish, a leather effect finish, or any other finish that is commonly found, for example, inside a vehicle cabin.

The additional layer may be a protective coating.

For example, the additional layer may be a further injection moulded layer.

The additional layer may be provided with one or more cut outs to enable enhanced depth effects to be achieved when the user views the additional layer through the cut outs (e.g. if the cut outs have different depths).

The control unit may comprise a thermally conductive element encapsulated at least partially within the injection moulded layer and configured to conduct heat to or away from the at least one electronic component.

The use of a thermally conductive layer within the control unit provides several advantages. Firstly, during assembly of the control unit, the high temperatures associated with the injection moulding process which may cause heat build up in the electronic components, which may otherwise cause damage to the circuit, is conducted away from the circuit, either to a remote component or to the circuit-carrying and/or second member, depending on where the thermally conductive element is thermally connected. The remote component may take the form of a part of the injection moulding tooling equipment, for example, or alternatively the thermally conductive layer may be in contact with the component-carrying member and/or second member and conduct heat to these members. Secondly, during use, as components of the electronic components and circuitry heat up during use, the heat is transferred away via the thermally conductive element.

In this way unwanted heat energy from the electronic components may be beneficially used to heat the ambient environment in the vicinity of the control unit. By way of specific example, where the control unit comprises a part of the interior of a vehicle cabin, heat energy may be transferred from the circuit-carrying member and/or the second member to the cabin environment by thermal radiation or convection. In this manner, localised heating may be provided within the vehicle cabin, thereby reducing the load on the vehicle HVAC system.

The control unit may comprise at least one gate through which the material of the injection moulded layer is injected during manufacture of the control unit.

It is helpful to locate the at least one gate so that it is spaced remotely from electronic components which are active components, so that material that is injected through the gate during manufacture of the control unit is less likely to damage the structure due to the high pressures and temperatures associated with the injection moulding process.

The component-carrying member and/or the second member may comprise a pre-formed member i.e. a member that is formed prior to the formation of the injection moulded layer.

If the control unit forms a control unit for a vehicle, the control unit may comprise at least one electronic component configured to control one or more of the following vehicle functions; an airbag, an entertainment system, a sound system, a window, a seating system, a lighting system.

According to another aspect of the invention, there is provided an apparatus having a control unit in accordance with the first aspect, wherein the apparatus has at least one function under the control of the control unit.

For example, the apparatus may take the form of a vehicle.

According to another aspect of the invention, there is provided a method of manufacturing a control unit for an apparatus, the method comprising pre-forming a circuit-carrying member in a first pre-forming step; providing at least one electronic component on the circuit-carrying member to provide a function of the apparatus, in use; and injecting an injection mouldable material onto the at least one electronic component to at least partially encapsulate the at least one electronic component in an injection moulded layer.

By way of example, the method may comprise pre-forming a second member in a second pre-forming step, and, following the first and second pre-forming steps, injecting the injection mouldable material between the component-carrying member and the second member to at least partially encapsulate the or each of the electronic components in the injection moulded layer.

A simple and convenient manufacturing method can therefore be achieved to provide a lightweight, robust and low cost control unit for numerous applications.

Within the scope of this application it is expressly intended that the various aspects, embodiments, examples and alternatives set out in the preceding paragraphs, in the claims and/or in the following description and drawings, and in particular the individual features thereof, may be taken independently or in any combination. That is, all embodiments and/or features of any embodiment can be combined in any way and/or combination, unless such features are incompatible. The applicant reserves the right to change any originally filed claim or file any new claim accordingly, including the right to amend any originally filed claim to depend from and/or incorporate any feature of any other claim although not originally claimed in that manner.

Figure 2:
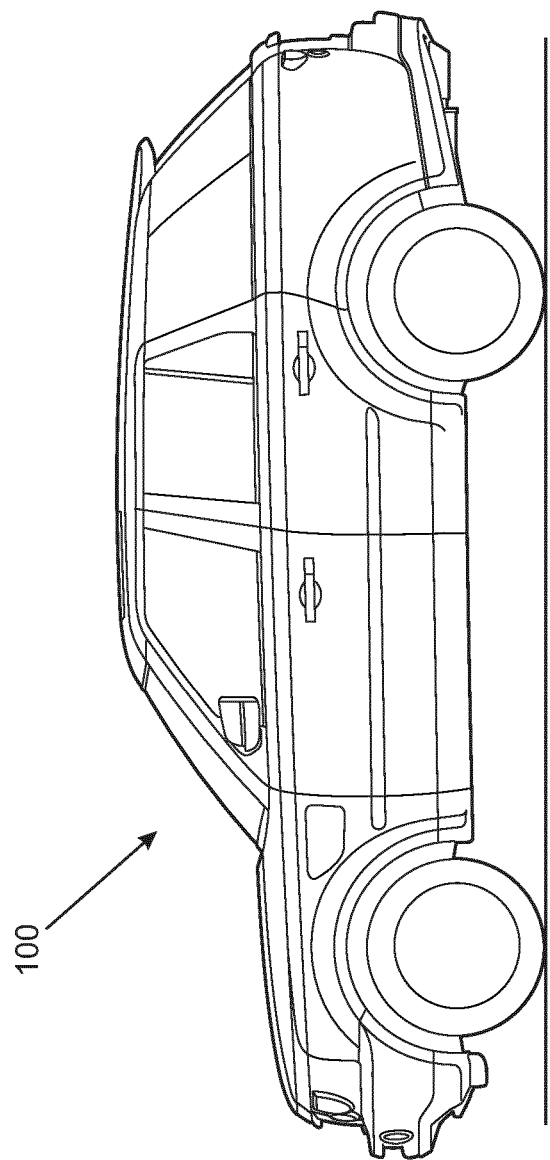
Figure 3:
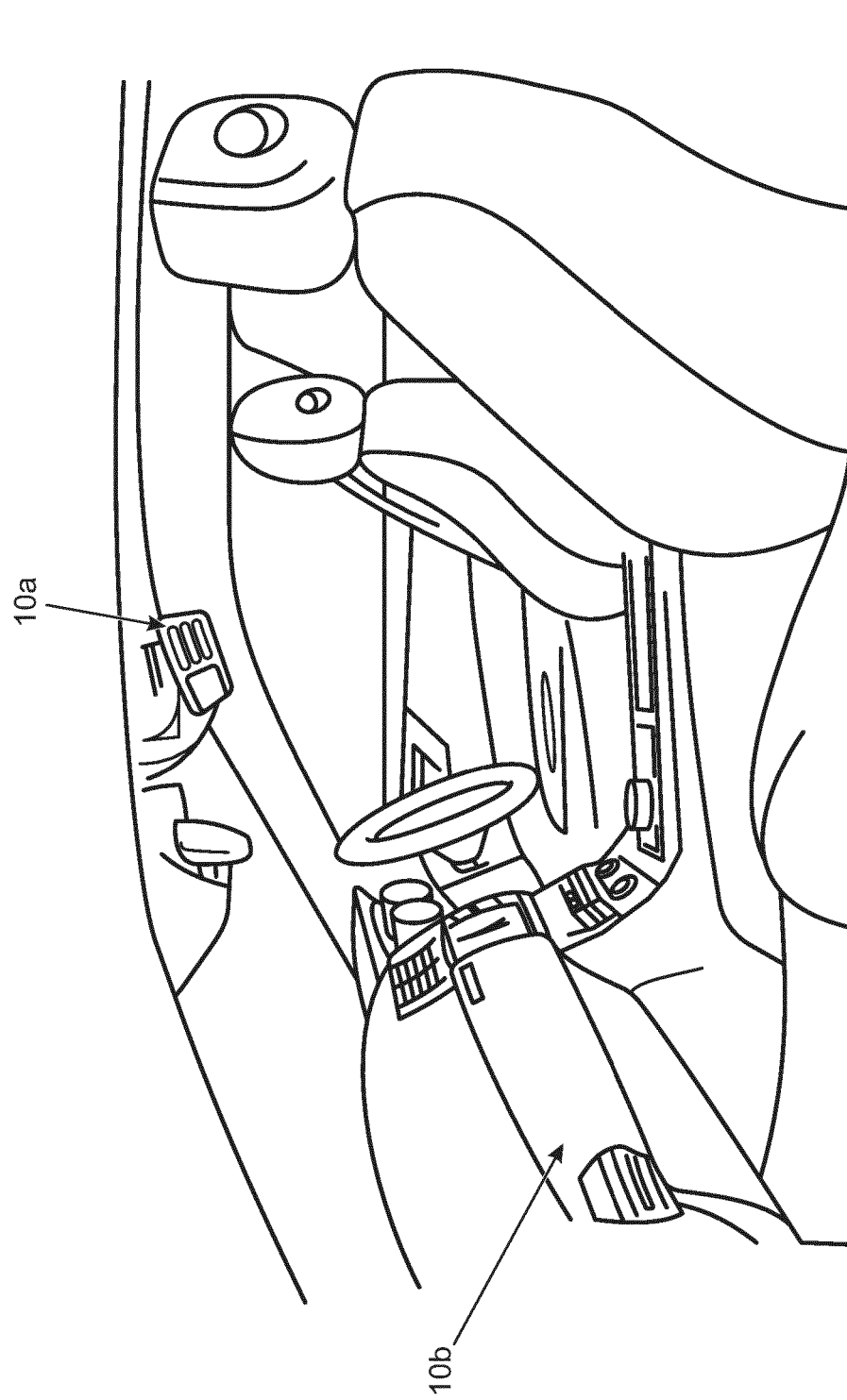
Figure 4:
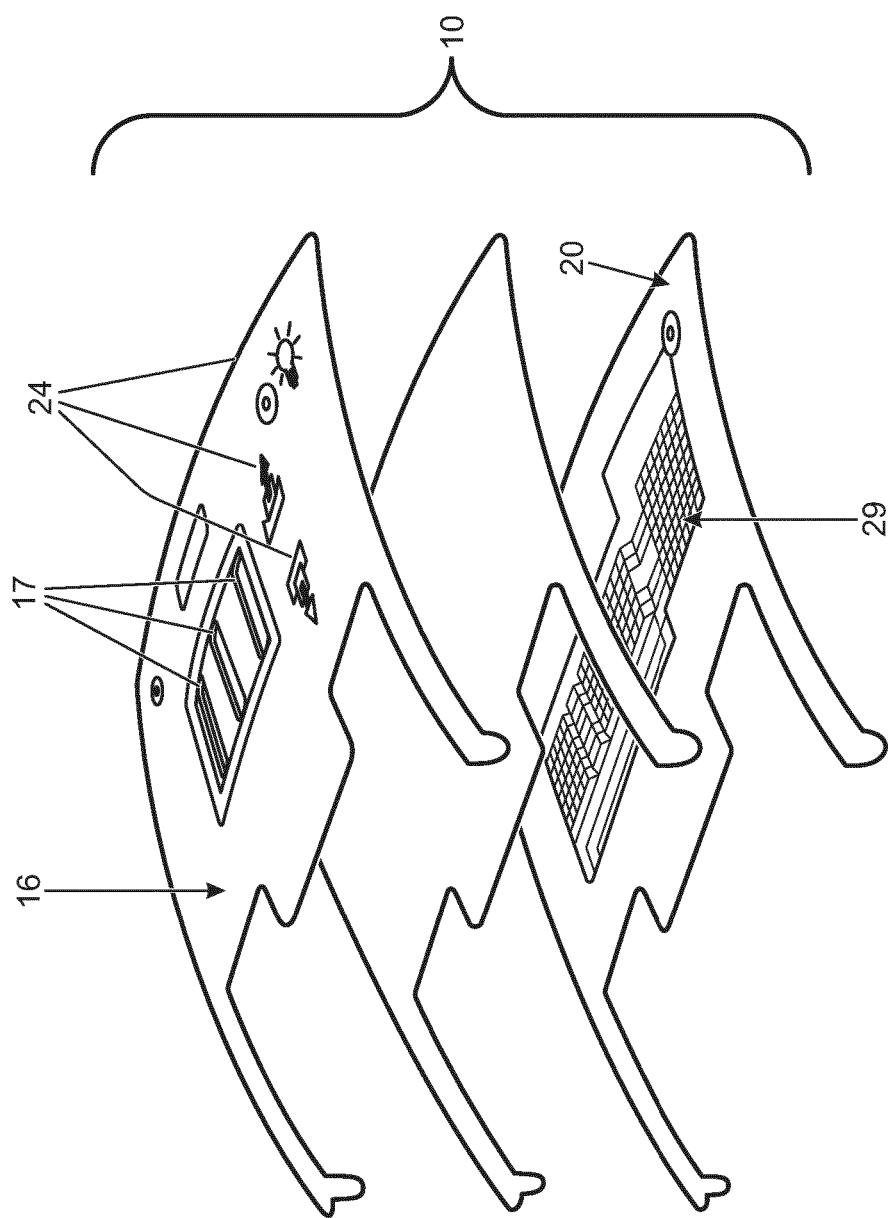
Figure 5:
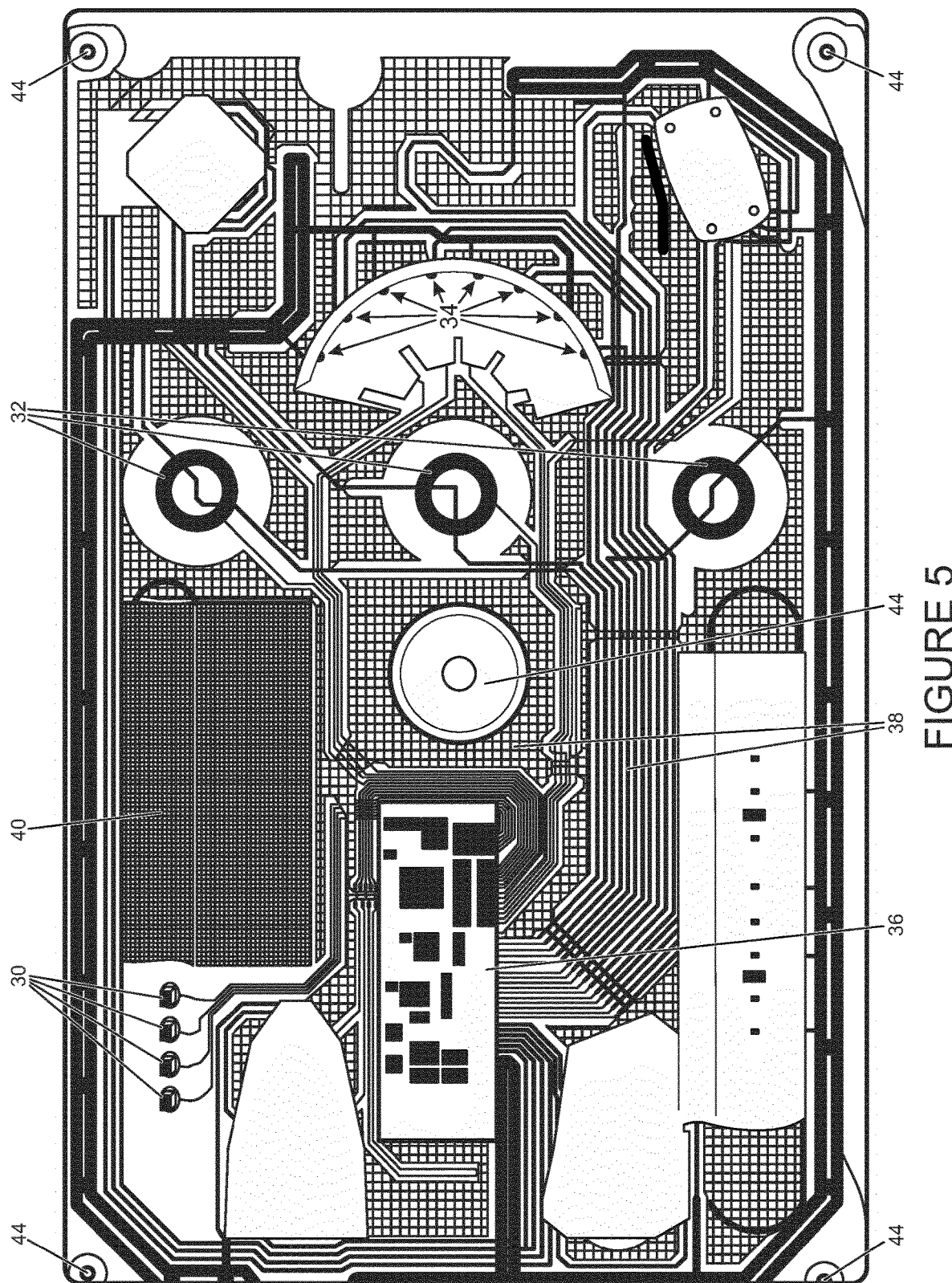
Figure 6:
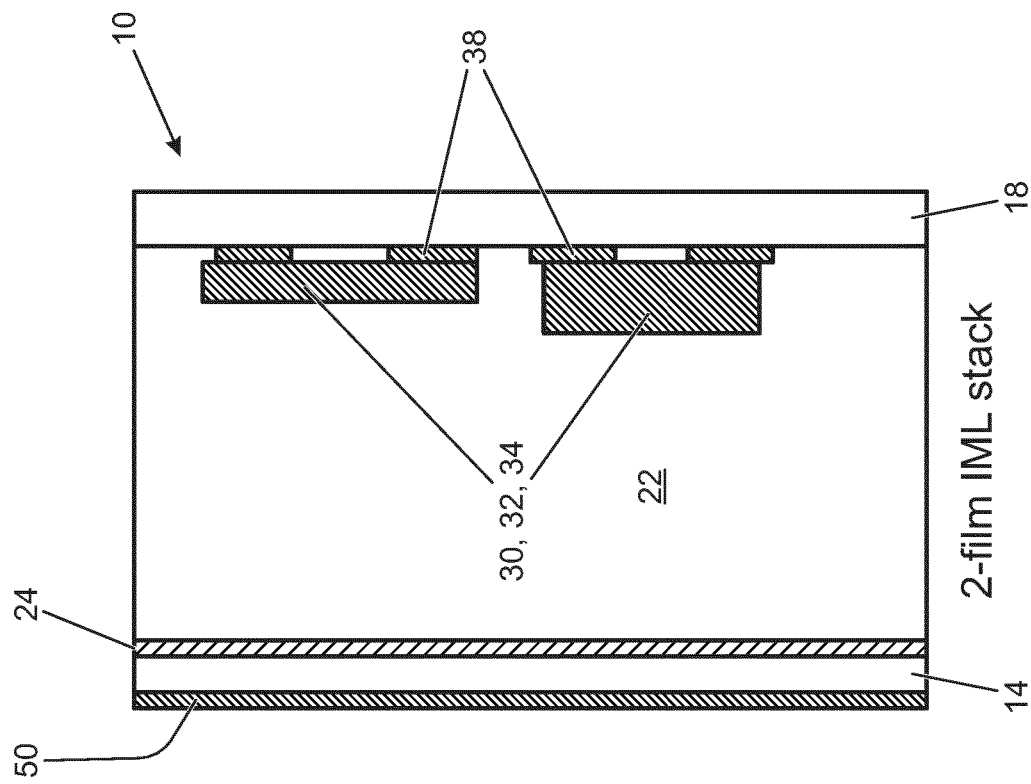
Figure 7:
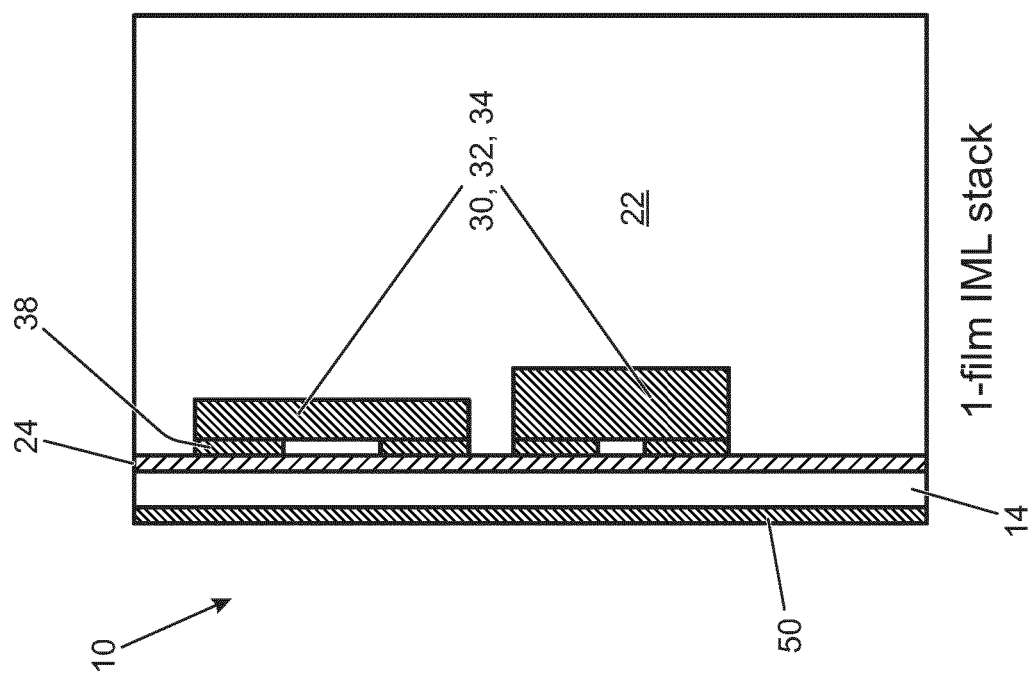
Figure 10:
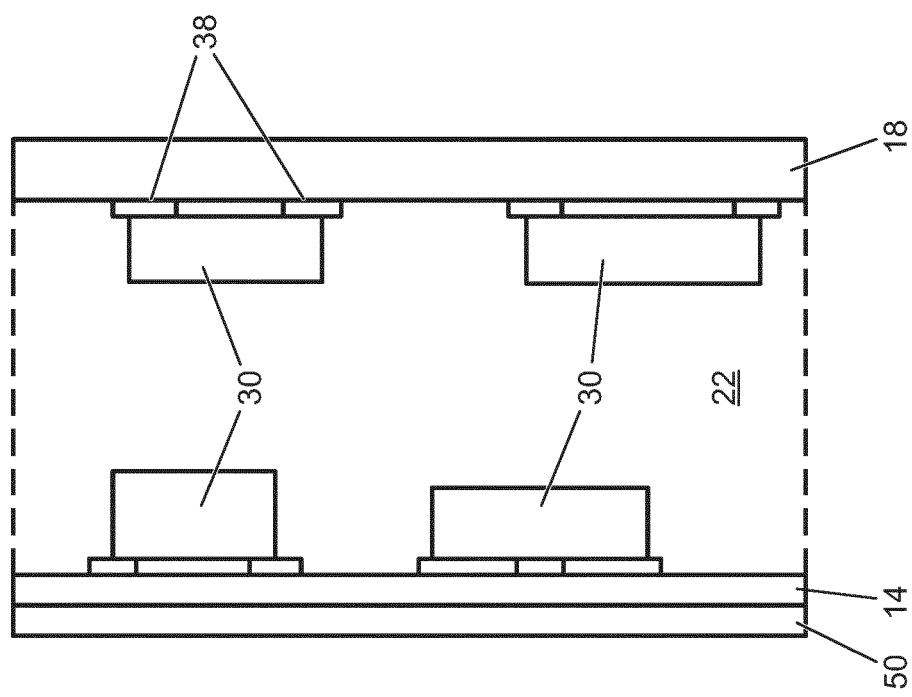
Figure 11:
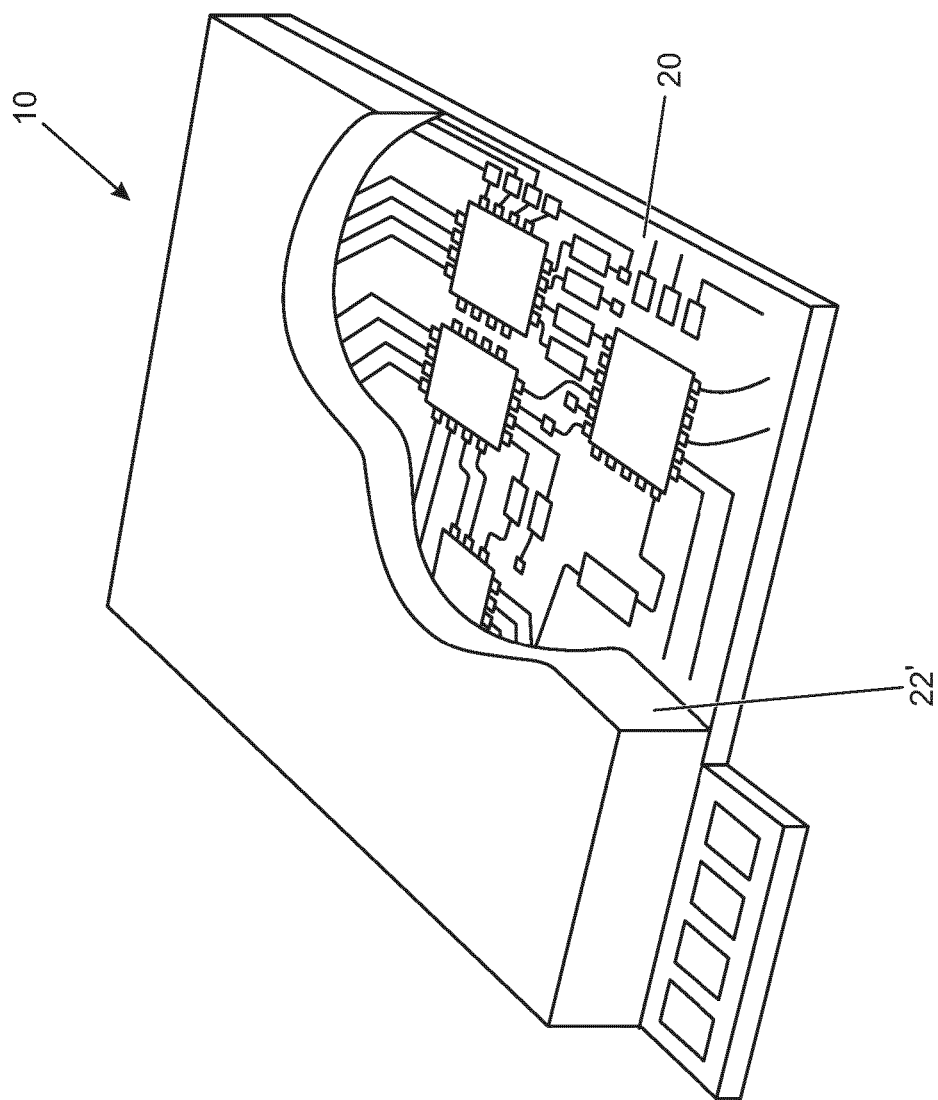
Figures 12, 13:
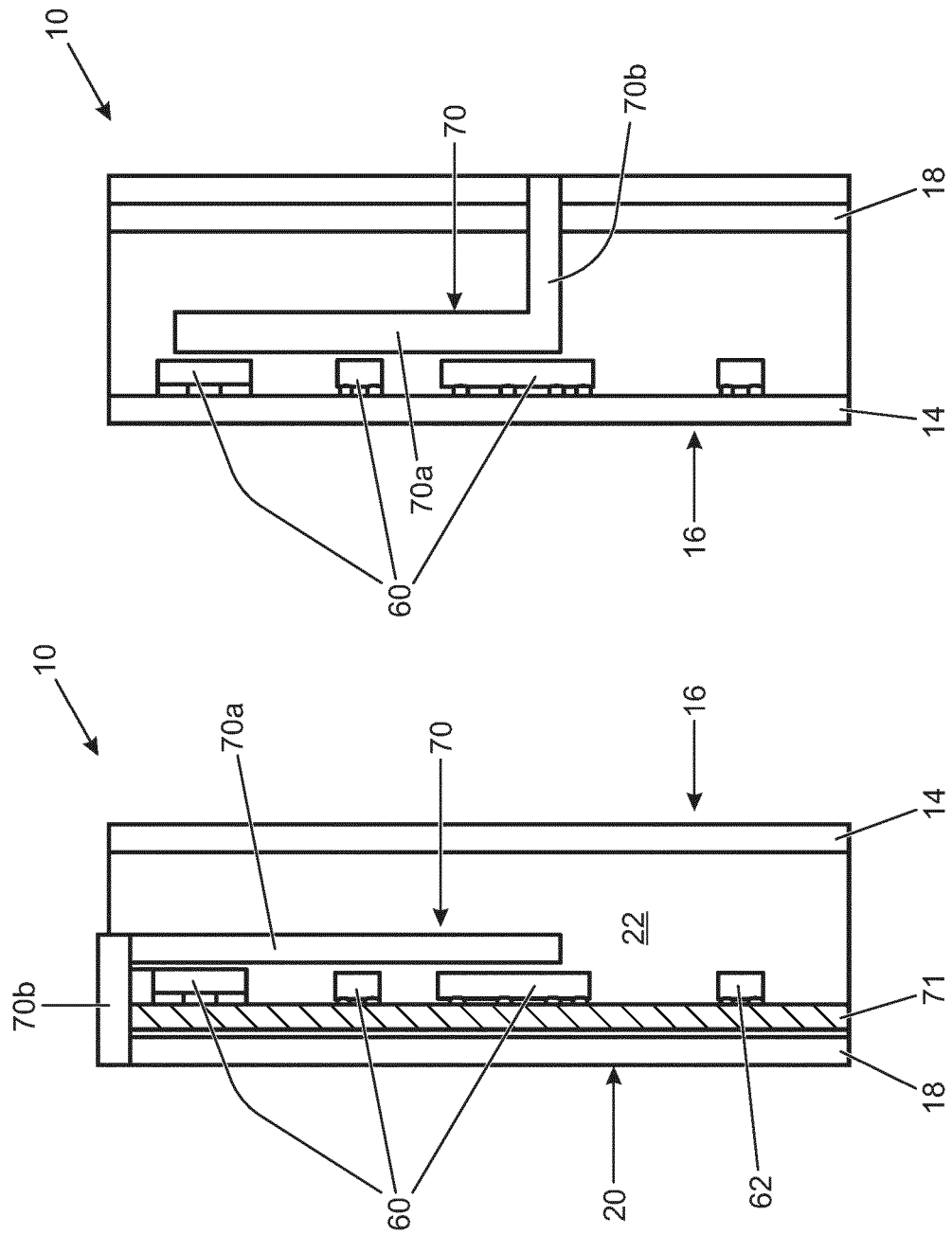
Figure 14:
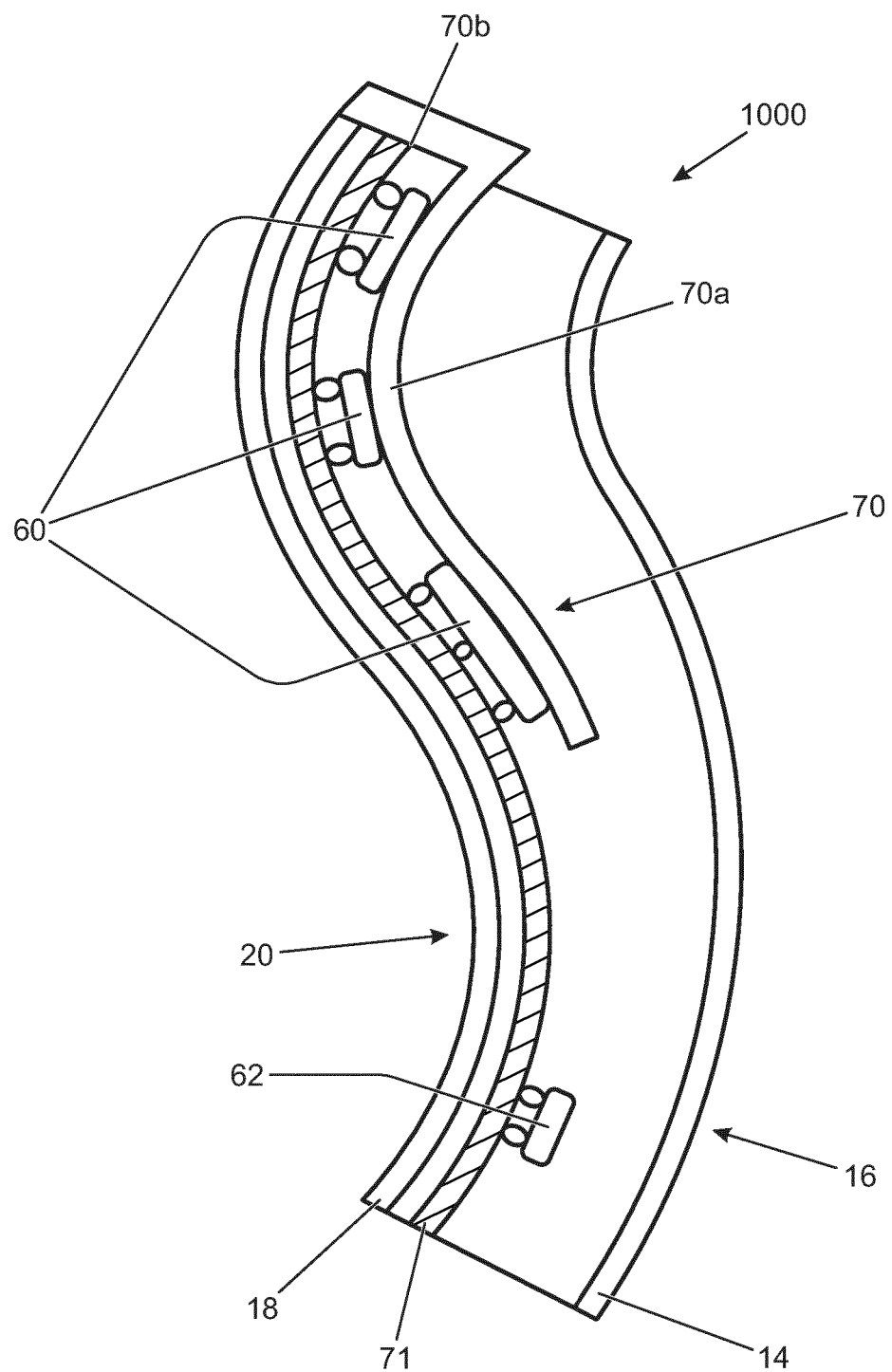
Figure 15:
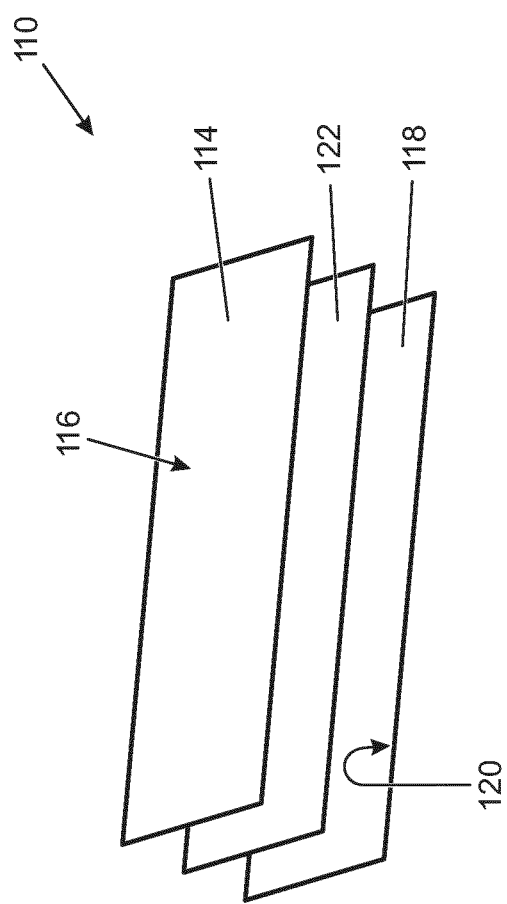
Figure 16:
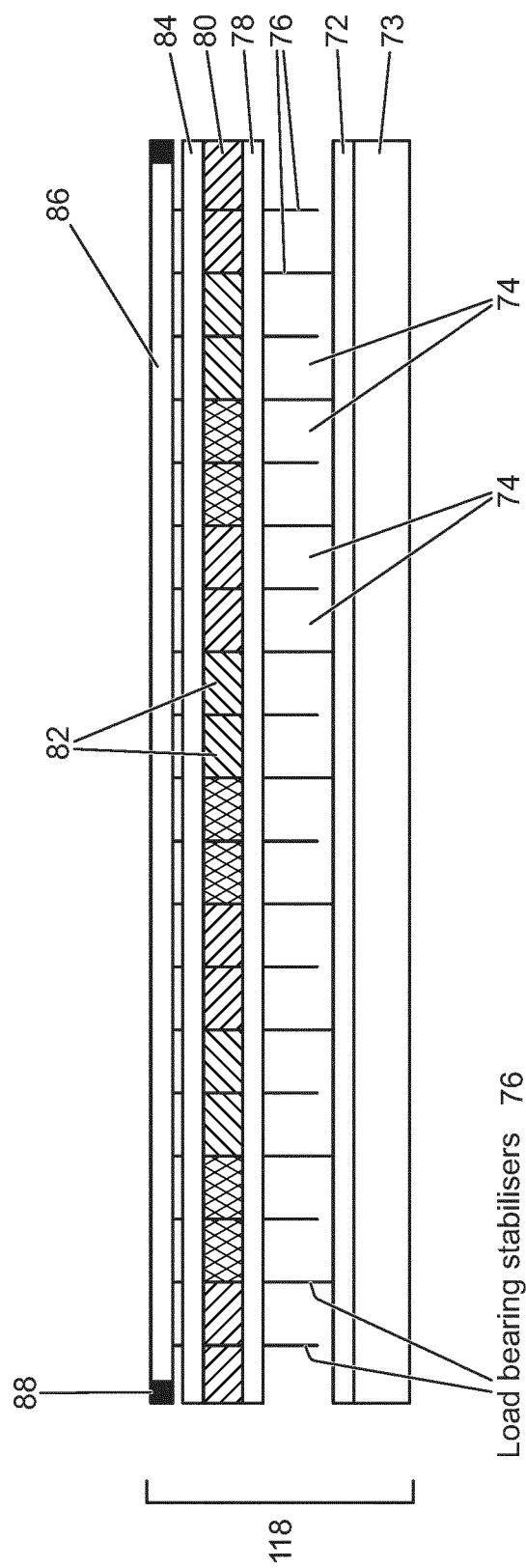
Figure 18:
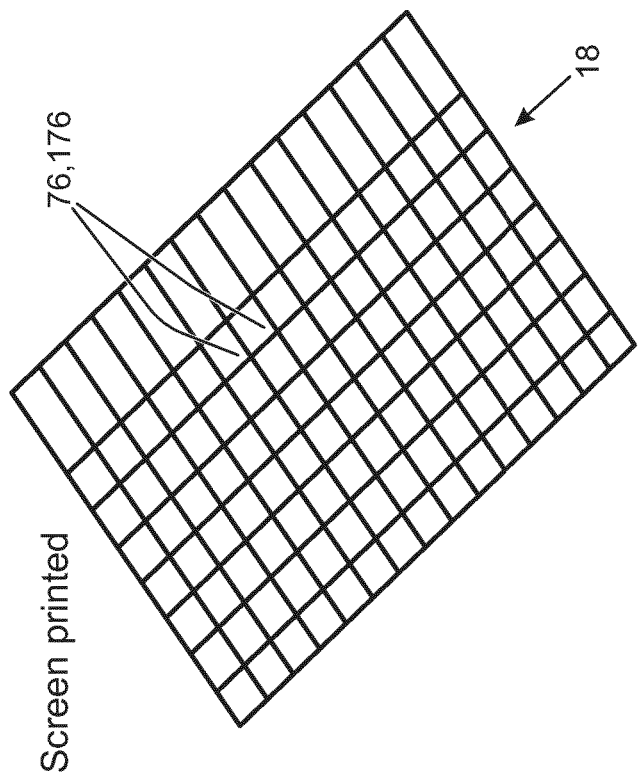
Figure 17:
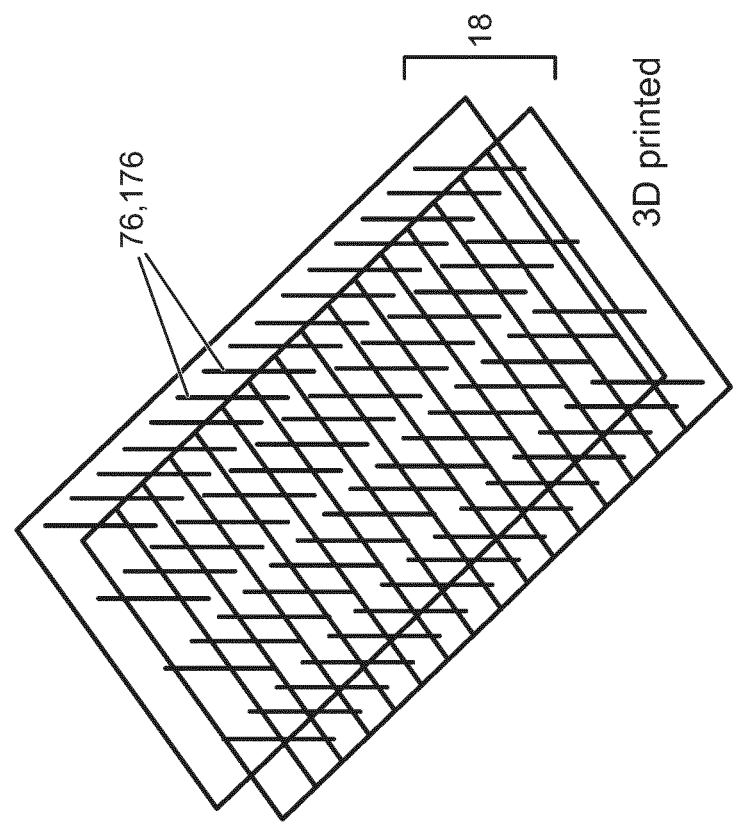

One or more embodiments of the invention will now be described, by way of example only, with reference to the accompanying drawings, in which:

FIG. 2 is a side view of a vehicle with which embodiments of the invention may be used;

FIG. 3 is a perspective view of the interior of the vehicle in FIG. 2, to show positions where the control unit of embodiments of the invention may be employed;

FIG. 4 is an exploded view of a control unit of a first embodiment of the invention which may be used in a vehicle of the type shown in FIGS. 2 and 3;

FIG. 5 is a plan view of a printed electronics layer forming part of the control unit in FIG. 4;

FIG. 6 is a schematic cross section of the control unit in FIG. 4 formed using a single shot injection moulding process;

FIG. 7 is a schematic cross section of a control unit of a second embodiment, also formed using a single shot injection moulding process;

FIG. 8 is a schematic cross section of a control unit of a third embodiment, formed using a twin shot injection moulding process;

FIG. 9 is a schematic cross section of a control unit of a fourth embodiment, formed using a single shot injection moulding process;

FIG. 10 is a schematic cross section of a control unit of a fifth embodiment, formed using a single shot injection moulding process;

FIG. 11 is a perspective view of a control unit of a sixth embodiment with only partial encapsulation of the printed electronics layer;

FIG. 12 is a schematic cross section of a control unit of a seventh embodiment, comprising a heat sink arrangement;

FIG. 13 is a schematic cross section of a control unit of a eighth embodiment with a different heat sink arrangement to that shown in FIG. 12;

FIG. 14 is a schematic cross section of a control unit of a ninth embodiment, in which the profile of the control unit is curved;

FIG. 15 is a schematic perspective view of a control unit formed by a lamination process;

FIG. 16 is a schematic cross section of a printed electronics layer which may be used in embodiments of the invention;

FIG. 17 is a perspective view of a portion of the printed electronics layer in FIG. 16 to show a support structure thereof; and FIG. 18 is a perspective view of a portion of a printed electronics layer in an alternative embodiment to that shown in FIG. 17 to show an alternative support structure for the printed electronics layer.

DETAILED DESCRIPTION

Figure 1:
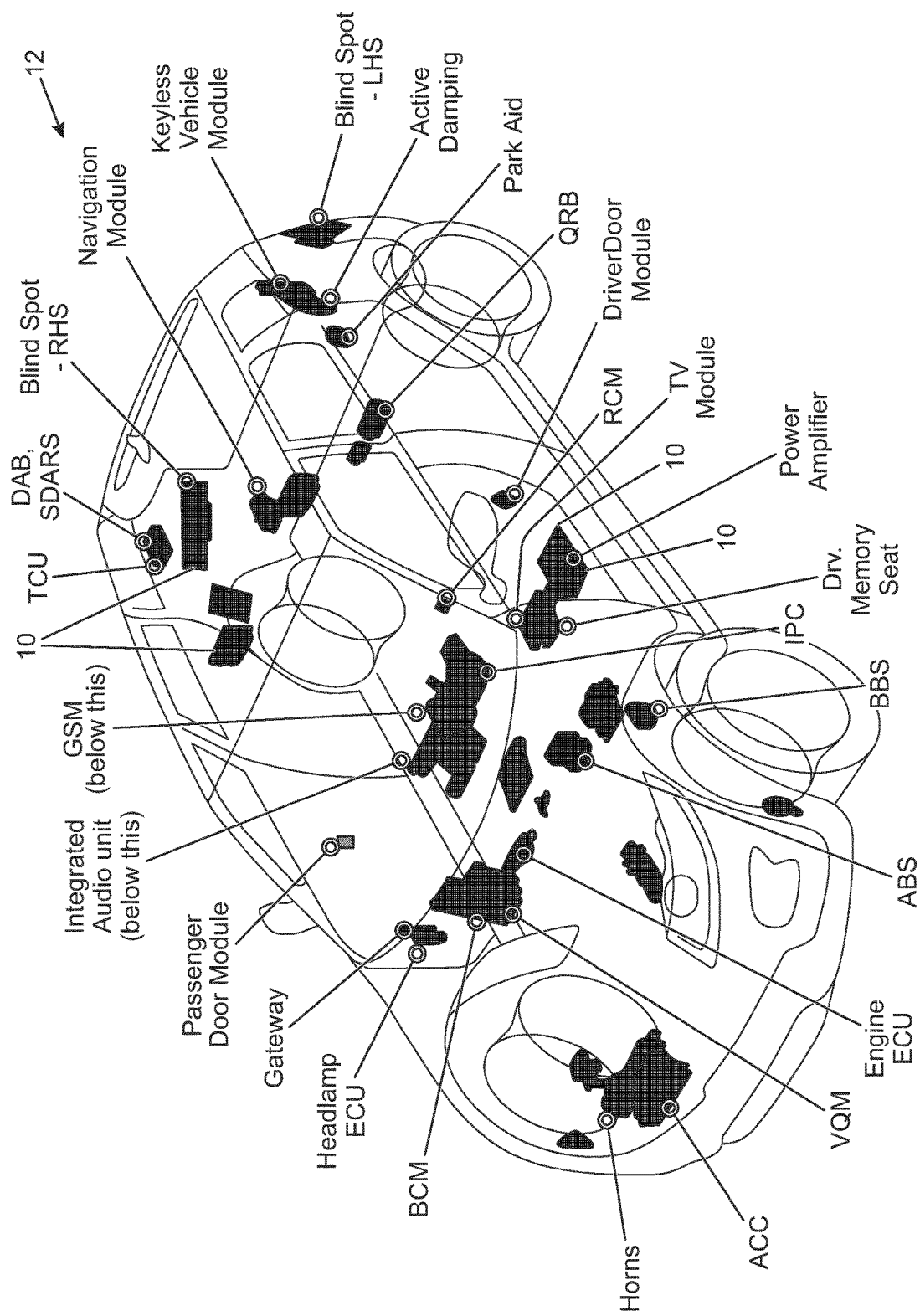
FIG. 1 is a schematic diagram of a known vehicle to show the positions of various electronic control units located around the vehicle.

Referring to FIG. 1, in a modern day vehicle the various functions within the vehicle cabin, together with the engine and power train systems, require numerous control units (or controllers) to be situated in already limited accommodation space within the vehicle. FIG. 1 illustrates just some of the possible positions for the control units, some of which are identified with reference numeral 10, which may be distributed throughout the vehicle 12. It is not uncommon, for example, for a vehicle 12 to be provided with in excess of 70 such control units 10, including those for the cabin lighting systems, the air bags, the sunroof, the roof blinds, the windows, the front and rear seats, the parking sensor system, various other sensor systems around the vehicle and the vehicle entertainment system.

FIG. 2 is a side view of a vehicle 100 with which embodiments of the invention may be used to provide advantages over known vehicles. The interior of the vehicle is shown in FIG. 3, where two possible positions for the control unit of the invention are identified. In one position the control unit takes the form of an overhead control unit, referred to as 10a, which may be used to control various vehicle functions, including lighting, a sunroof and/or blinds. In another position the control unit takes the form of a cover or lid for a glove compartment, which has a curved surface profile. Various vehicle functions may be controlled using the control unit forming part of the glove lid compartment including, by way of example only, lighting, seating, heating, audio visual and satellite navigation functions.

FIG. 4 is an exploded view of a first embodiment of the control unit 10 of the invention which by contrast with existing control units provides a compact and relatively light weight structure which can be housed more readily within the confines of the vehicle cabin. The control unit 10 comprises three elements or members; a first member 14 which defines a user-interaction surface for the user in the form of a presentation surface 16 which is visible to the user when the control unit 10 is installed in its operating location. The presentation surface may be referred to as the A-surface 16 of the unit. The user may also interact with the presentation surface by means of touch.

The control unit 10 further comprises a second member 18 which defines a B-surface 20 of the unit, and an intermediate member in the form of an injection moulded layer 22 interposed between the first and second members 14, 18. Typically in a vehicle, reference to an "A-surface" is a surface which is presented to a user of the vehicle and/or with which a vehicle user interacts, for example for the purpose of initiating control of a function within the vehicle, whereas a "B-surface" is a non-interacting surface that is usually hidden from the view of the user. The A- and B-surfaces may be defined by opposed surfaces of the same member, or as is shown in FIG. 4 may be defined by separate members 14, 18 which are separate from one another.

It will be appreciated from the following description that either the first or the second member may form the component-carrying member of the control unit 10 (i.e. that member upon which the electronic components are provided). The phrase 'member' may be taken to mean any part, element, layer or other component of the control unit.

The first and second members 14, 18 are generally plate-like members, but in other configurations may take the form of thinner members or simply a layer of material. The first and second members 14, 18 are pre-formed members which are pliable and flexible, at least during the assembly stages of the control unit, as will be described in further detail below. The pre-formed first and second members 14, 18 are placed in the injection mould prior to the injection moulding process which forms the injection moulded layer 22.

Referring to FIG. 4, the A-surface is defined by a first thermoformed member 14 which is pre-formed by first heating a plastic sheet to a pliable temperature, and then laying the pliable sheet in a mould so that the plastic material adopts the shape of the mould before it is then cooled. Graphical features 24 (only a few of which are labelled) are applied to the A-surface 16 to provide features, such as icons or symbols, which provide an indication to the vehicle user about how to control various functions provided by the finished control unit. Typically the graphical features are applied by laying a printed layer into the mould to define the required graphical icons and symbols. A three-dimensional finger track or groove 17 is provided on the A-surface into which a user can place their finger to run their finger along the track, optionally applying pressure to the surface or through capacitive touch to initiate a control of a vehicle function as described in further detail below. The A-surface 16 typically defines a visible surface in the vehicle cabin with which the user interacts. For example, the A-surface may provide a surface of an arm rest, an overhead control panel, a tray table, a seat control switch pack, a glove box lid, or a part of the vehicle dashboard.

The B-surface 20 is defined by a second thermoformed member 18 which takes the form of a pliable member, at least during the manufacturing steps of the control unit 10. The second member 18 is formed in the same way as described previously for the first member 14 and a plurality of active and/or passive electronic components and printed tracks or wires are applied to the member 18 using known techniques. Typical passive components take the form of resistors, capacitors, inductors and transformers and diodes, whereas typical active components are those which act upon a source of current, such as amplifiers, switches, light emitting diodes (LEDs), integrated circuits, memories and microcontrollers. Typically, the B-surface 20 may be provided with one or more of the following features; an integrated circuit, a microprocessor, light emitting diodes (LEDs), user-interactive components such as pressure sensitive track, grid sensors, resistors, antennae, capacitors, sensors, quartz clocks, inductors, and conductive prints or tracks for carrying current. Known techniques for printing of the wires and tracks onto the B-surface 20 include screen printing, flexo printing, gravure, offset lithography, inkjet, aerosol deposition or laser printing.

Being pre-formed, thermoformed parts, the first and second members 14, 18 are lightweight and robust in nature, and can be formed with an aesthetically pleasing shape, contour and/or finish. This is particularly relevant for the A-surface 16 which provides the interaction surface for the user and is visible to the user within the vehicle cabin. The thermoforming process also enables a whole host of different shapes to be achieved for the members 14, 18. For example, the first and second members 14, 18 are formed from materials which are pliable during the assembly stages so as to give them the desired shape for the injection mould. In other embodiments, the first and second members 14, 18 may be formed from materials and/or may be of a thickness, which retains a degree of flexibility or pliability even when the control unit 10 is full assembled.

In the present embodiment the first and second members 14, 18 are generally planar with a slight curvature on their upper surfaces. In other embodiments, for example, the members may be more fully curved or rounded, at least in part, as determined by the shape of the available accommodation space which they are intended to occupy within the vehicle. Typical materials from which the first and second members 14, 18 are formed include polycarbonate materials or thermoplastic polymer resins such as polyethylene terephthalate (PET). Other examples of injection moulding engineered thermoplastic materials include polyphenylene sulfide (PPS), polyether sulfone, acetals, polypropylenes, polyether imide (PEI), polyethylenes, polyphenylene oxide (PPO), acrylonitrile butadiene styrene, polyurethanes (PUR), thermoplastic elastomers, polyphthalamide (PPA), polyethylene naphthalate (PEN), polyimide (PI), including plexiglass.

In other embodiments of the invention the first and second members 14, 18 may take the form of vacuum formed elements or members, as opposed to thermoformed elements or members. Other pre-forming methods may also be used to produce the 'pre-formed' members 14, 18, prior to performing the injection moulding process.

FIG. 5 shows one example of a B-surface 20 which may form a part of the second member 18 of the control unit 10 in FIG. 4. When in situ within the vehicle the B-surface 20 may define at least a part of an overhead control panel for controlling various lighting functions in the ceiling of the cabin and operation of a vehicle sunroof and/or roof blinds, as mentioned previously.

The B-surface 20 is provided with a printed electronics layer (identified as 29 in FIG. 4) including a first set 30 of four LEDs provided in a horizontal arrangement in a first zone (top left) of the surface, a second set 32 of three LEDs provided in a vertical arrangement in a second zone just to the right of the vertical centreline of the surface and a third set 34 of LEDs provided in an arc arrangement located adjacent to the second zone. It will be appreciated that the use of the terms horizontal and vertical in this description is made with reference to the orientation in the figures, but is not intended to be limiting.

The positions of the first, second and third zones on the B-surface 20 correspond to associated regions on the A-surface 16 which are provided with graphical features to identify the positions of the zones underneath when the members 14, 18 are assembled in a 'stack', as indicated in FIG. 4. The four LEDs 30 in the first zone may typically take the form of low level illumination LEDs to provide mood lighting on the ceiling of the vehicle, or to illuminate other features of the control unit. The three LEDs 32 in the second zone may typically take the form of higher power LEDs providing task lights for the vehicle. Various other light sources may be incorporated on the control panel including LEDs for providing ambient lighting effects, LEDs for illuminating hidden-until-lit features, Emergency-call features (E-call features) or Breakdown-call features (B-call features), and LEDs for illuminating icons or graphical features which provide indicators to the user about various functions of the control unit 10.

The B-surface 20 is further provided with a hybrid integrated circuit 36 for controlling and powering the various electronic components 30, 32, 34. Conductive prints or conductive tracks (two of which are identified by 38) are printed on various regions of the B-surface to provide current to the various components 30, 32, 34. In practice a greater number of tracks may be provided than is necessary for each component 30, 32, 34, for reasons which shall be explained later. The conductive tracks 38 include copper tracks (e.g. forming part of the hybrid integrated circuit 36) which provide fast connections to the microcontrollers and microprocessors of the hybrid integrated circuit 36, and silver tracks which carry current from the hybrid integrated circuit 36 to the other components (e.g. components 30, 32, 34) of the printed electronics layer. The substrate for the printed electronics layer may take the form of a polyester (PET), polyethylene naphthalate, polyimide, or plexiglass.

A grid sensing region 40 is provided in a three-dimensional groove formed along the upper edge of the B-surface 20 which corresponds to the position of the aforementioned three-dimensional groove provided in the A-surface. The groove 40 is shaped to receive the groove formation 26 of the A-surface when the members 14, 18 are assembled together. In use, sliding movement of the user's finger along the groove 26 provides a variable control function, or 'slider' function (for example using a piezoelectric or capacitive touch function) which may be used in particular to control the opening of a vehicle sunroof, as described in further detail below.

In the centre of the B-surface 20, and in each of the four outermost corners, openings are provided, also referred to as 'gates' 44, into which a moulding material is injected in order to form the third member 22 between the first and second members 14, 18. The first and second members 14, 18 are first placed into respective injection moulds with their various features in place, as described previously, and then the material for the intermediate member 22 is injected through the gates 44 into the cavity between the outer members 14, 18. Typically the material that is injected between the first and second members 14, 18 is a polycarbonate material, or other material suitable for injection moulding. Such polycarbonate materials are highly robust and may be transparent. The material is injected into the cavity at high temperature and pressure, and is then cooled so that the material adopts the shape of the cavity between the first and second members 14, 18, to complete the three-layer structure of the control unit 10 shown clearly in FIG. 4. Other suitable materials for the moulded layer include most polymers (resins), including thermoplastics, thermosets, and elastomers. The materials selected for the first and second pre-formed members 14, 18 may be materials which are bendable or foldable in their final state, or may provide a more rigid structure, depending on the application.

The position of the gates 44 is an important feature of the assembly in that the gates need to be positioned in areas where the high pressures and temperatures associated with the injection moulding process do not cause damage to any of the more sensitive and fragile electronic components on the B-surface 20. By way of example with reference to FIG. 4, based on manufacturing process considerations the central gate position is advantageous as it allows a uniform distribution of the injection moulding material between the first and second members 14, 18, to define an intermediate layer 22 of substantially uniform thickness. The gates are positioned so as to disperse the pressure of flow evenly between the surfaces of the members 14, 18. However, it does place the injection point of the central gate in quite close proximity to some of the components on the B-surface 20 (e.g. the LEDs and the integrated circuit). In other embodiments it may be possible to remove the central gate 44 altogether, and to rely only on the corner gates to introduce the injection moulding material between the members 14, 18. However, a balance is needed between the higher pressures required to inject the material into the central region between the members, in order to achieve a uniform layer across the entire surface, and the need to protect sensitive electronic components on the B-surface from such higher pressures. It is most advantageous to locate the more sensitive active components, such as clocks, sensors, antennae and capacitors, in positions on the surface 20 that are remote from or spaced well away from the gates.

Once the moulded layer 22 is formed between the two members 14, 18 the control unit 10 takes its final form, comprising the first member 14 defining the A-surface 16 with graphical features with which the user can interact, the second member 18 defining the B-surface 20 which carries the various electronic components controlled by the user interactions with the A-surface 16, and the moulded layer 22 between the first and second members to provide rigidity and structure to the unit.

FIGS. 6 and 7 are schematic views of two possible configurations for the control unit 10 which may be formed using a single shot injection moulding process in which the injection moulding material is introduced into the mould to form the intermediate layer 22 of the control unit 10, as described previously.

In FIG. 6 the graphics layer is laid on the reserve side of the A-surface (which would be transparent to allow visibility of the graphics layer). On top of the A-surface 16, an additional hard coat 50 is applied as a protective surface as this is the surface that is exposed in the vehicle cabin and may be subject to scratches and knocks, in use. In this example the moulded layer 22 is approximately 2-3 mm in thickness, so that the overall structure is relatively thin and lightweight in comparison with known electronic control units. The active electronic components 30, 32, 34 and conductive prints or tracks 38 are applied to the B-surface 20 at the rear of the structure, as described previously. The configuration shown in FIG. 6 can be formed using a single-shot injection moulding process to form the intermediate layer 22.

In addition, a piezoelectric layer (not shown) may be laid immediately beneath the first member 14 (i.e. in intimate contact with or in very close proximity to the first member 14). The piezoelectric layer is a pressure-sensitive layer via which the underlying electronic components 30, 32, 34 are controlled by the user applying a pressure to the surface of the first member 14 to provide a piezoelectric control function for the underlying electronic components 30, 32, 34.

In other embodiments (not shown), electrode and dielectric layers may be provided in the layer-structure of the control unit 10 to provide a capacitive touch functionality for the unit. The electrode layer and dieletric layers may be provided by the conductive tracks (such as 38). In this configuration a small voltage is applied to conductive tracks on the second member 18, resulting in a uniform electrostatic field. When a conductor, such as a human finger, touches the surface of the first member 14 a capacitor is dynamically formed with the conductive tracks. An underlying controller printed on the second member 18 can then determine the location of the user's touch indirectly from the change in the capacitance as a result of the touch. This in turn can be used to control the underlying electronic components 30, 32, 34. The three dimensional grooves 26, 40, and the slider function provided by a user sliding their finger through the groove 26 of the first member 14, may be implemented by means of a piezoelectric or capacitive touch function.

In practice the capacitive touch effect may be enhanced if a ground plane is incorporated into the structure at the rear of the second member 18 (i.e. on the opposite side to the moulded layer 22).

In the case of capacitive touch embodiments there is no need for intimate contact between an electrode layer and the first member 14 in the same way as for a piezoelectric-based activation, because the change in capacitance as a result of touch is enough to indicate control.

Many other layers may be incorporated into the structure to provide touch-sensitive or other user-control functions of the control unit 10, including resistive layers, piezoelectric layers, electromagnetic layers, Quantum Tunnelling Composite (QTC) layers, electric field (e-field) layers and RF layers.

FIG. 7 is an alternative embodiment of the control unit in which the need for the second member of the structure is avoided and the electronic components 30, 32, 34 and conductive prints or tracks 38 are formed on the reserve side of the first member 14 (i.e. the surface on the reverse of that with which the user interacts). In this case the control unit is built up by first applying the graphical features 24 to the rear surface of the first member 14 and then applying a hard coat 50 to the front surface of the first member 14 to provide the protective layer. The electronic components and conductive tracks 38 are then applied to the rear surface of the first member 14, and the assembly is placed into a mould. The injection moulded material (e.g. polycarbonate) is introduced into the mould to produce the injection moulded layer on the reverse side of the first member 14, encapsulating the electronic components 30, 32, 34 and conductive tracks 38. The control unit structure in FIG. 7 can also be formed using a single shot injection moulding method to form the layer 22, as for FIG. 6.

FIGS. 8 and 9 show alternative embodiments which may be formed using a twin shot (2K) injection moulding method. FIG. 8 is similar to the embodiment of FIG. 6 in that the electronic components 30, 32, 34 and the conductive prints 38 are mounted on the second member 18 and are spaced from the front surface of the control unit by the moulded layer 22. However, the need for the first member is removed in this embodiment. Instead, the graphical features 24 are laid into a mould and the second member 18 is laid into a facing mould. A first shot of injection moulding material is then introduced into the gates 44 to fill the cavity between the moulds, and the material is cooled and set. Using a second mould the hard coat 50 is then formed at the front face of the structure using a second shot of injection moulded material (i.e. the hard coat is formed directly onto the moulded layer 22).

FIG. 9 is a further alternative embodiment in which a second shot of injection moulded material is used to produce enhanced depth effects at the front surface of the control unit 10. In this embodiment only one member 14 is required to support the electronic components 30, 32, 34 and conductive tracks 38. These components and tracks are applied immediately behind the graphical features 24 which are applied on the rear surface of the first member 14, as described for FIG. 7. A first shot of injection moulded material is then applied into a mould to encapsulate the rear surface of the first member 14, together with the electronic components 30, 32, 34 and the graphical features 24. A second shot of injection moulded material is then injected into a facing mould to encapsulate the front face of the first member 14, and to define a relatively thick and transparent front layer 52. The depth of the transparent layer 52 on the front of the structure can be used to provide enhanced depth effects for the graphical features 24 on the rear surface of the first member 14. For example, the transparent layer may be provided with various cut outs or holes of varying shapes and depths to provide different illumination effects from the LEDs 30, 32, 34.

In other embodiments (not shown) the hard protective coating 50 applied to the front surface of the first member 14 may take the form of a veneer, such as a wood effect veneer, which matches or complements the trim of the vehicle cabin in which the control unit 10 is intended to be used. In this way the control unit readily lends itself to occupying a prominent location within the vehicle cabin, and as such can be accommodated within an arm rest, overhead panel or the dashboard, for example, due to its aesthetically attractive finish. For example, the veneer may take the form of any thin layer of suitable material, such as wood, carbon-fibre, polymer heat shrink plastic, metal, textile or leather.

FIG. 10 is a further alternative embodiment of the invention in which both the first and second members 14, 18 are provided with electronic components, identified as 30, together with the necessary conductive tracks 38. As mentioned previously the first member 14 may be provided with a protective coating 50, although this is not essential. This embodiment may be particularly useful for a control unit which is configured for gesture control, wherein the electronic components need to be located close to the A surface of the control unit but other electronic components may be located on the B surface of the control unit. For example, it may be that one surface of the control unit is not of sufficient area to accommodate all the necessary electronic components, or alternatively it may be beneficial to spread the distribution of the electronic components, for example to minimize local heat generation from the components, in use.

The embodiment shown in FIG. 10 may be provided with a connector (not shown) which is configured to apply the required currents to the electronic components. It may be desirable to control the electronic components on each of the members 14, 18 using a common connector, as opposed to individual connectors being used for each one.

FIG. 11 shows a further alternative embodiment in which the encapsulation of the printed electronic components by the moulded layer 22' is only partial across a surface of the structure. This may be useful, for example, if the accommodation space for the control unit is particularly limited, and the unit can be located partially within an already enclosed and safe environment without the need for extra encapsulation across the entire printed electronics layer.

Because of the high temperatures and pressures of the aforementioned injection moulding process, and despite the careful positioning of the gate(s) away from the most fragile and sensitive electronic components, some damage may occur to the conductive elements or tracks as the injected material is introduced through the gate(s) into the mould cavity. For this reason it may be beneficial to locate active electronic components in positions away from the gates 44, and passive electronic components closer to the gates 44, as the passive components are less likely to be susceptible to damage.

In addition, some electronic components require a higher current for performance (e.g. higher powered LEDs), so it is beneficial to allow for redundancy of these tracks to ensure that, even allowing for some breakage or damage during the injection moulding process, enough current can be delivered to the components through the remaining tracks which are not broken or damaged.

For the reasons described above the selection criterion for where particular components are located may be to locate active electronic components away from the gates, and passive components in closer proximity to the gates. Another criterion may be to consider whether a component is critical for the desired functioning of the control unit 10. If a component is considered critical to the operation of a control unit (for example, an LED light that provides illumination for a control unit for an indicator), then it is beneficial to locate the critical component away from the location of the gate so that the likelihood of damage to the conductive tracks supplying current to the LED, and/or damage to the LED itself, is minimised. It is also beneficial to locate the more fragile copper conductive tracks of the B-surface further away from the gates, whereas the silver conductive tracks may be more robust to the high pressure flows through the gates during injection moulding.

Because the control unit is pliable during assembly, prior to the setting of the injection moulded material, a degree of flexing of the conductive tracks to the electronic components may occur during manufacture. Also, for embodiments in which the control unit maintains a degree of pliability following manufacture the risk of damage occurring to the conductive tracks, in use of the control unit, also remains. To counter any damage which may arise, it may be beneficial to provide an excess of conductive prints or tracks to provide some redundancy for the tracks in the event that such damage arises. In particular, redundant conductive tracks 38 may be provided in the regions local to the gate(s) 44, which are those regions most susceptible to damage as they experience the highest pressures. By providing for track redundancy in this way, it is possible to ensure that even in the event of breakages a suitable number of tracks is maintained so that the specific current requirements for the electronic components, and the impedance at the junction between the electronic component and the conductive tracks, is maintained as required.

Another problem which may arise is that the cooling and curing process which follows the high temperatures and pressures associated with the injection moulding process may lead to shrinkage and breakage of the tracks 38 due to the deformation of the underlying layer or substrate to which they are applied. Care therefore needs to be taken in selecting an appropriate ink viscosity for the conductive tracks 38 and the density of the track lines. The size and density of the tracks is dependent not only on the positioning relative to the gates, but also the electrical load requirements for the components to which the tracks connect.

As described further below, other methods of manufacturing the control unit of the invention may be employed to avoid the aforementioned problems altogether.

In order to provide additional protection for the more thermally sensitive electronic components it may be beneficial to incorporate a heat-sink arrangement into the control unit to transfer heat that builds up during the injection moulding process away from the sensitive components. The provision of a heat-sink arrangement also has benefits in operation of the control unit as it allows heat that is generated in use to be dissipated away from the areas of the control unit which may be damaged or caused to malfunction in the event of overheating.

FIG. 12 shows an embodiment of the control unit 10 which is similar to the embodiment in FIG. 8 in that it includes a first member 14 which defines an A-surface 16 of the control unit, such as a presentation surface to the user with which the user interacts visually, and a second member 18 which defines a B-surface 20 upon which various electronic components 60, 62 are mounted. In the example shown the B-surface is provided with three electronic components 60 which are sensitive to overheating, and one component 62 which is less sensitive to overheating. Conductive tracks (not identified), as described previously, are also provided on the second member 18 to provide current to the electronic components 60, 62.

A heat transfer arrangement, which may be referred to as a heat-sink arrangement 70, is included in the control unit. The heat transfer arrangement takes the form of a thermally conductive layer is provided to make contact with the three heat-sensitive electronic components 60. The thermally conductive layer 70 includes a main body region 70a which overlays the electronic components 60, making contact therewith, and a contact region defined by an extension region 70b which projects from the main body region 70a at one end to make contact with one end of the second member 18. Heat that builds up in the electronic components 60 is transferred, via the thermally conducting layer 70, to the second member 18 so that, by thermal conduction, heat is dissipated away from the components 60. If any of the electronic components is less susceptible to high temperatures, such as the component labelled 62, the thermally conducting layer 70 need not extend to that component, as shown in FIG. 12. The heat sink arrangement 70 may also include an additional layer 71, adjacent to the second member 18 and to which the electronic components 60 are thermally connected, to provide an enhanced heat transfer function. This is because the additional layer 71 provides another route for heat transfer away from the electronic components 60 to the second member 18.

Heat dissipation away from the electronic components 60 via the thermally conducting layer 70 occurs during the injection moulding process when the temperatures around the components are especially high, but heat transfer also continues during use of the control unit 10 when the electronic components may also heat up. The provision of the thermally conducting layer heat sink is therefore advantageous in manufacture of the control unit, and during its use.

The material of the thermally conductive layer may be graphene or a meta material with high thermal and low electrical conductivity. For example, the layer may be formed from phyllosilicates or a mica sheet. Other suitable materials are insulators (low electrical conductivity) where atomic vibrations (phonons) are very efficient at transporting heat. Often, high phonon thermal conductivity occurs in materials with light elements (especially, B, C, N, O), because heat is mostly transported by acoustic phonons whose group velocity (the speed of sound in the material) is inversely proportional to atomic mass. Examples of materials with high thermal conductivity and low electrical conductivity are certain metamaterials and polymorphs of boron nitride, silicon carbide, silicon nitride, and aluminium nitride.

FIG. 13 shows an alternative embodiment of the control unit 10 provided with a heat transfer arrangement. In this embodiment the electronic components 60 are provided on the reverse of the first member 14 (i.e. on the opposed surface to the A-surface 16) and the second member 18 provides structural support for the control unit 10. As described previously for the embodiment in FIG. 12, a main body region 70a of a thermally conductive layer 70 is overlaid onto the three electronic components 60 which are most susceptible to damage or malfunction in the event of overheating. An extension region 70b of the layer 70 projects substantially perpendicularly from the main body region 70a to intercept the second member 18 at the rear of the control unit 10. As before, heat from the electronic components 60 is transferred via the layer 70 to the second member 18 so as to protect the components from damage and/or malfunction due to overheating, either in manufacture or during use.

A further alternative embodiment (not shown) makes use of a heat transfer feature which does not form a part of the final control unit structure, as in FIGS. 12 and 13, but instead forms a part of the manufacturing tool used for the injection moulding process. This provides protection from heat for the electronic components during manufacture only.

In a still further embodiment (not shown) in which a heat sink arrangement is employed, a Peltier heat pump or a loop heat pipe may be used in combination with the thermally conductive element so as to provide a means of active control of heating or cooling of the encapsulated electronic circuit.

In other embodiments it is envisaged that the thermally conductive heat transfer arrangement may be configured to conduct heat to the electronic components of the printed electronic circuit, for example, without limitation if there are other features of the control unit require heat to be transferred away from them.

FIG. 14 shows another embodiment of the invention in which the arrangement of the layers 14, 18, 22, 71 is the same as for the embodiment in FIG. 12, except that each layer is not flat but follows a curved or undulating profile. The curved or undulated nature of the control unit is achieved by utilizing the pliability, or flexibility, of the layers during assembly to achieve the desired profile for the final product. This allows the control unit to adopt a variety of shapes and to be used in a whole host of applications. For example, within a vehicle, the control unit may be utilized as a lid for a glove compartment (as shown in FIG. 3) or an arm rest in the vehicle, or it may be shaped or moulded to define any other surface of the vehicle interior where it may be useful to provide a control functionality within a component which has another purpose.

It will be appreciated from the foregoing description that the invention provides a robust, lightweight structure for the control unit which lends itself to be located within a vehicle cabin where it is visible to the user due to the high-quality and versatile finish that can be achieved on the A-surface 16 with which the user interacts. The shape of the control unit is highly versatile by virtue of the flexibility of the structure, at least during assembly. One such embodiment is the overhead control panel described previously and as shown in FIGS. 3 and 4. Other applications for the control unit include an arm rest control panel for controlling the vehicle windows or door locks, a centre console control panel for controlling the vehicle's entertainment system, or as a lid of a glove compartment where a presentation surface can be presented to the user on the otherwise dead-surface of the glove compartment lid.

In another embodiment (not shown), the control unit forms a part of a vehicle sun-visor. Typically, the sun-visor in a vehicle takes the form of a pull-down flap which obscures a region of the windscreen when in its pulled-down configuration so as to reduce glare for the user, but can be stowed in an upper substantially horizontal configuration, resting against the top of the windscreen frame, when not in use. Conventional sun visors are often provided with a vanity mirror and a light source which illuminates the area around the mirror and the user's face when the sun visor is pulled down. The light source is either operable by a switch on the sun visor or may light up automatically as the visor is pulled down. In the present invention the control unit may be mounted on the sun visor so that the electronic components (whether mounted on the reverse of the A-surface or on a B-surface) are packaged conveniently within the sun visor unit to provide enhanced functionality for the lighting. By way of example, the level of lighting provided by the light source may be controlled in dependence on ambient lighting levels, or the timing of illumination from the light source may be controlled in dependence on other vehicle parameters or operating modes. The invention therefore enables an integrated light emitting system to be provided in the small confines of a vehicle sun visor to give improved lighting features.

In other embodiments of the invention when utilised in a vehicle, the invention may take the form of a display panel for presenting information to the user, rather than providing an interaction surface for the user. For example, the control unit may be configured to control a hidden-until-lit feature of the vehicle whereby illumination of the feature by a light source (e.g. LED) of the control panel highlights the feature to the user which is otherwise not visible.

In any of the aforementioned embodiments the materials and/or thickness of the various layers may be selected so as to ensure that the final assembled product of the control unit retains some flexibility or pliability. It is important that layers have a degree of pliability during manufacture, so as to enable the final product of the control unit to be manipulated into the desire shape during the assembly process. It may be beneficial for the control unit to adopt a rigid structure in its final form (e.g. by virtue of the first and second members, and the injection moulded layer 22, when set, being rigid), but in other embodiments it may be beneficial for the first and second members and the injection moulded layer to retain some flexibility e.g. to permit bending of the control unit, in use. For example, the flexibility may enhance user interaction by providing a flexible, interactive, touchable surface.

The previously described embodiments of the invention are formed using an injection moulding process to produce the intermediate layer of the control unit (as in FIGS. 6 and 8) and/or the encapsulation layer(s) (as in FIGS. 7 and 9). In order to avoid the problems associated with the high temperatures and pressures of the injection moulding process, alternatively the control unit structure may be formed using a lamination process to replace the injection moulded layer with a laminate layer. FIG. 15 is a schematic diagram to show a control unit 110 formed using laminate layers. As described previously, the first member 114 defines an A-surface 116 which carries graphical features as indicators to the user about how to control the unit. The second member 118 defines a B-surface 120 which carries the various electronic components and conductive tracks (not shown in FIG. 15). The third member 122, which is situated between the first and second members 114, 118, takes the form of a lamination layer such as a glue layer.

In order to assemble the control unit 110 using the lamination process the first member 114 is first pre-formed using a thermoforming process, as described previously, and is laid into a mould. The second member 118 is formed using a similar process, as described previously, and is laid into a facing mould. The glue layer 122 is then laid onto the first or second member. The glue layer is pre-warmed so that it is pliable, but is formed of a material that does not require excessive pre-warming to give the required pliability.

Once the glue layer 122 is laid onto the first or second members 114, 118 the mouldings are brought together to apply pressure to the parts, sandwiching the glue layer 122 between the first and second members 114, 118. Heat is then applied to the structure so that the glue moulds itself exactly to the shape of the first and second members 114, 118 and adheres the parts together. The presence of the glue on the second member 118 is beneficial in that it provides a protective layer for the electronic components and circuitry during the heating phase. Moreover, as the glue layer is heated its phase change from a more solid to liquid form takes energy away from the components and circuitry. Finally the assembled structure is cooled so that the glue 'sets' to fix the first and second members 114, 118 securely together in a rigid structure with the glue forming an intermediate layer 122 between them.

In another embodiment (not shown) in which a laminate glue layer is used to hold the members of the control unit together, the need for two base members 114, 118 may be removed if the graphical features are laid directly into a mould rather than applying them to a first member 114. The glue is then laid directly into the mould, on top of the graphical features, and is sandwiched together with the second member 118 to form a two-layer structure with the graphical features being embedded or imprinted on the surface of the glue layer.

In a still further embodiment (not shown) the control unit may comprise two or three layers formed from a lamination process so that the layer upon which the electronic components and conductive tracks are printed is a flexible sheet or layer, rather than taking a rigid pre-form.

One benefit of the glue lamination process is that the high temperatures and pressures required for the injection moulding process are avoided. In addition, there is no need to accommodate gates within either the first and/or second members 114, 118 as the glue is simply laid onto one of the layers in pliable form. The lamination process also enables the stacking of integrated circuit components onto the B-surface (or the reverse of the A-surface) which may not otherwise be achievable due to the high temperatures and pressures of the injection moulding process which would too readily deform the stacked circuitry. Suitable materials for the lamination process include resins, vinyls, and ethylene copolymer resins.

Other embodiments envisage a hybrid arrangement of a laminated control unit structure in one part of the vehicle which is integrated with a moulded control unit structure in a common assembly. For example the arm rest of the vehicle may include a moulded high gloss unit with a wood-effect veneer having the control functions of the A-surface, with the laminated unit being adjacent to it to provide the resting surface for the arm.

FIG. 16 shows one possible configuration of the second member 118 which may be used to form a part of the control unit 10 in an embodiment where the control unit 10 takes the form of a display unit. The control unit may be used with an injection moulded layer 22, or a laminate encapsulation layer 122. The configuration shown in FIG. 16 is a laminated structure which is formed by layering different materials and electronic components onto a base layer (backlight layer 73) to achieve the desired lighting function.

The printed electronics are deposited onto the backlight layer 73 which provides a supporting structure to the second member 118 and provides a source of 'backlight' illumination for the components laid on top. A first polarising layer 72 is then laid onto the backlight layer 73 and an array of Liquid Crystal Display (LCD) elements 74 is then laid onto the first polarising layer 72. The LCD elements 74 may be deposited in the form of an ink and are interspersed with structural supports or bolsters 76, with one support 76 being located between adjacent LCD elements. A transistor layer 78 is laid over the LCD elements 74 and forms the switching layer for the LCD elements to which voltages are applied, under the control of a microprocessor (not shown), to control the LCD elements in the desired manner. An array of colour filter elements 80, typically RGB filter elements, is laid onto the transistor layer 78. The colour filter elements 80 are interspersed with further structural supports 82 in the same was as for the LCD elements 74. The structural supports 76, 82 may be formed from the same material, and indeed may be integral supports which pass through each layer of the structure 118. A second polarising layer 84 is then laid onto the colour filter elements 80 prior to applying an anti-reflective coating 86, such as glass or acrylic, to provide a suitable top surface finish to the second member 18. A heat sink arrangement 88 in the form of a thermally conducting layer, such as that described previously, may be incorporated into the laminated structure also.

The LCD elements 74 interspersed with the structural support elements 76 may be formed using a conventional ink jet or 3D printing process. By way of example, the 3D array of printing heads used to form the LCD elements 74 may have a first liquid crystal material provided in selected ones of the printing heads and a second, different material provided in others of the printing heads so as to give a regular array of LCD elements with structural supports arranged in regular locations between them. Typically the second material from which the structural supports 76 are formed is a curable resin which may be cured, for example, by UV radiation. It may be advantageous for the resin to be a transparent material so that the structures are not noticeably visible in the final product. If the final display unit 10 is intended to have some flexibility, then the supports 76 may be formed from silicon to provide a degree of support but still the requisite flexibility also. In this case, the shape of each support 76 is selected so as to ensure that the supports 76 still provide the required robustness, even when the final structure is flexed. In particular, the shape of the supports 76 is chosen to ensure that pressure applied to the supports is distributed evenly across the supports, even when the assembly is flexed. For example, the supports may take the form of V-shaped structures, or pillars of oval or circular cross section which maintain the ability to provide support even when flexing occurs.

In other embodiments different materials with different properties may be deposited to form the printed electronics layer. For example, inks having conductive, resistive, and semi conductive properties may be deposited on the component-carrying surface to form the printed electronic circuit, depending on the required functionality.

FIG. 17 shows the array of support elements 76 formed using a 3D printing process, as described previously, whereas in FIG. 18 the structural support elements 76 are formed using a screen printing process. The supports 76 may comprise a softer, more flexible material for flexible displays (such as silicon) or may comprise a harder, more rigid material (such as melamine) for rigid displays.

The LCD elements 74 are operated in a manner known in the art by applying a voltage to the transistor layer 78 to control the switching of the liquid crystal molecules in each element, which in turn determines whether light passing through the first polarising layer 72 is transmitted through the LCD elements 74 or is blocked.

In another embodiment (not shown), the structural support elements 76 within the second member 118 may be formed by first laying a resin layer onto, for example, the array of LCD elements 74 and then etching away the resin so that it does not obscure the transmission of light through the structure when the LCD elements are activated to transmit light, but leaving an array of suitably spaced structural supports to give mechanical strength to the second member 118.

The embodiment in FIGS. 16 to 18 has been described in terms of a liquid crystal display, but other types of display may be used in the invention, such as LEDs, OLEDs, AMOLED, quantum dot display electrophoretic and electro wetting displays. The display elements may be formed by using different inks to print different components such as those mentioned above.

If the injection moulding process is used to form the control unit structure as a whole, the configuration of the second member 18 shown in FIG. 16 is particularly beneficial because it provides extra rigidity to the second member 18 through the use of an array of mechanically stable supports or pillars 76 distributed throughout the printed electronic layer, which helps to withstand the high temperatures, and particularly pressures, that are experienced during the injection moulding process. Despite the rigidity provided by the supports or pillars 76, the overall structure may still retain a degree of flexibility or pliability when it its final form so as to enable its shape to be adapted, depending on the usage requirements, as discussed previously.

It will be appreciated that many modifications may be made to the above examples without departing from the scope of the invention as defined in the accompanying claims. By way of example, although embodiments of the invention have been described with reference to a control unit for a vehicle, it will be appreciated that the invention has other applications outside of the automotive sphere. For example, alternatively the invention may be employed in a variety of appliances where there is a need for a user interaction surface and/or a surface where information is displayed to a user (e.g. a control panel on an electrical item). With this in mind, in any of the aforementioned embodiments the A-surface of the control unit need not take the form of a surface with which the user interacts, but may take the form of a surface via which information is displayed or presented to the user of the control unit.

The invention claimed is:

1. A control unit for an apparatus, the control unit comprising:
   a first component-carrying member provided with at least one electronic component configured to provide a function of the apparatus, wherein the first component-carrying member is a pre-formed layer of a material that is pliable at least during assembly of the control unit;
   a second component-carrying member which defines a user-interaction surface visible to a user of the apparatus, wherein the second component-carrying member is a pre-formed layer;
   a piezoelectric layer adjacent to the user-interaction surface to enable control of the at least one electronic component when the user applies pressure to the user-interaction surface to indicate a user command;
   an injection molded layer encapsulating at least a part of the at least one electronic component;
   wherein the second component-carrying member is provided with at least one further electronic component, so that the at least one electronic component on the first component-carrying member and the at least one further electronic component on the second component-carrying member are sandwiched between the first component-carrying member and the second component-carrying member within the injection molded layer; and
   wherein the user-interaction surface is configured to receive a user command, and wherein the at least one electronic component is operable in response to the user command.

2. The control unit as claimed in claim 1, wherein the first component-carrying member remains pliable once the control unit has been fully assembled.

3. The control unit as claimed in claim 1, wherein the second component-carrying member is spaced from the first component-carrying member by the injection molded layer to define a structure for the control unit including at least three layers.

4. The control unit as claimed in claim 1, comprising a component-carrying surface which carries the at least one electronic component and wherein the component-carrying surface and the user-interaction surface are on opposite sides of the first component-carrying member.

5. The control unit as claimed in claim 1, wherein the at least one electronic component forms a part of a printed electronic circuit comprising a plurality of conductive tracks for carrying current to the at least one electronic component.

6. The control unit as claimed in claim 5, wherein the conductive tracks act, together with the user-interaction surface, as electrodes of a capacitor to provide a capacitive touch control functionality in response to the user command.

7. The control unit as claimed in claim 5, wherein a greater number of conductive tracks is provided on the printed electronic circuit than is required to provide current to the at least one electronic component of the printed electronic circuit.

8. The control unit as claimed in claim 7, wherein a greater number of conductive tracks is provided on the printed electronic circuit in regions in a vicinity of a gate for injecting a material of the injection molded layer during assembly of the control unit.

9. The control unit as claimed in claim 1, comprising an additional layer provided on the user-interaction surface to provide an aesthetic finish to the control unit.

10. The control unit as claimed in claim 1, wherein the user-interaction surface is provided with at least one graphical feature to provide an indication to the user about at least one function of the electronic component.

11. The control unit as claimed in claim 1, comprising a thermally conductive element encapsulated at least partially within the injection molded layer and configured to conduct heat to or away from the at least one electronic component.

12. The control unit as claimed in claim 11, wherein the thermally conductive element includes a contact region configured to make contact with at least one of the first component-carrying member and a remote component during assembly of the control unit, thereby to conduct heat to or away from the at least one electronic component via at least one of the remote component and the first component-carrying member.

13. The control unit as claimed in claim 12, wherein the thermally conductive element includes an extension piece which projects from the first component-carrying member to define a contact region.

14. The control unit as claimed in claim 11, wherein the thermally conductive element is a layer of thermally conductive material laid onto at least one of the electronic components.

15. The control unit as claimed in claim 1, comprising at least one gate through which the material of the injection molded layer is injected during manufacture of the control unit.

16. A vehicle comprising the control unit of claim 1.

17. A method of manufacturing a control unit for an apparatus, the method comprising:
　pre-forming a first component-carrying member in a first pre-forming step;
　pre-forming a second component-carrying member in a second pre-forming step, wherein the second component-carrying member defines a user-interaction surface visible to a user of the apparatus, in use;
　providing at least one electronic component on the first component-carrying member to provide a function of the apparatus;
　providing a piezoelectric layer adjacent to the user-interaction surface to enable control of the at least one electronic component when a user applies pressure to the user-interaction surface to indicate a user command;
　providing at least one further electronic component on the second component-carrying member; and
　injecting an injection moldable material onto the at least one electronic component to at least partially encapsulate the at least one electronic component within an injection molded layer so that the at least one electronic component on the first component-carrying member and the at least one further electronic component on the second component-carrying member are sandwiched between the first component-carrying member and the second component-carrying member within the injection molded layer.

18. The method as claimed in claim 17, comprising:
　following the first and second pre-forming steps, injecting the injection moldable material between the first component-carrying member and the second component-carrying member to at least partially encapsulate the at least one electronic component and to define a structure for the control unit that includes at least three members; and
　wherein the first pre-forming step comprises injection-molding the first component-carrying member.

* * * * *